(12) United States Patent
Takezawa et al.

(10) Patent No.: US 6,524,721 B2
(45) Date of Patent: Feb. 25, 2003

(54) CONDUCTIVE ADHESIVE AND PACKAGING STRUCTURE USING THE SAME

(75) Inventors: Hiroaki Takezawa, Nara (JP); Takashi Kitae, Osaka (JP); Yukihiro Ishimaru, Osaka (JP); Tsutomu Mitani, Osaka (JP); Tousaku Nishiyama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/898,721

(22) Filed: Jul. 3, 2001

(65) Prior Publication Data

US 2002/0043652 A1 Apr. 18, 2002

(30) Foreign Application Priority Data

Aug. 31, 2000 (JP) ......................................... 2000-262244

(51) Int. Cl.⁷ ........................ H01L 23/14; H01L 29/12; B22F 7/04; B32B 15/02
(52) U.S. Cl. ........................ 428/554; 428/557; 428/560; 428/564; 428/620
(58) Field of Search ................................ 428/554, 557, 428/560, 564, 620

(56) References Cited

U.S. PATENT DOCUMENTS

| | | | |
|---|---|---|---|
| 5,005,107 A | * | 4/1991 | Kobashi et al. ............. 361/540 |
| 5,376,403 A | * | 12/1994 | Capote et al. ................ 148/24 |
| 5,867,074 A | * | 2/1999 | Ogiso et al. ............ 310/313 A |
| 6,205,657 B1 | | 3/2001 | Kawakita et al. |
| 6,344,157 B1 | * | 2/2002 | Cheng et al. ................ 252/512 |

FOREIGN PATENT DOCUMENTS

| | | |
|---|---|---|
| JP | 5-81923 A | 4/1993 |
| JP | 7-254308 | 10/1995 |
| JP | 10-190239 | 7/1998 |
| JP | 11-54880 | 2/1999 |
| JP | 2000-22023 | 1/2000 |
| JP | 2000-133043 | 5/2000 |

OTHER PUBLICATIONS

"Mechanisms Underlying the Unstable Contact Resistance of Conductive Adhesives", 1999 Electronic Components and Technology Conference, pp. 342–346 No Month.

"Mechanisms Underlying the Unstable Contact Resistance of Conductive Adhesives", IEEE Transactions on Electronics Packaging Manufacturing, vol. 22, No. 3, Jul. 1999, pp. 228–232.

* cited by examiner

Primary Examiner—John J. Zimmerman
Assistant Examiner—Jason Savage
(74) Attorney, Agent, or Firm—Merchant & Gould P.C.

(57) ABSTRACT

The present invention provides a conductive adhesive and a packaging structure that can keep moisture-proof reliability even when a multipurpose base metal electrode is used. A conductive adhesive according to the present invention includes first particles having a standard electrode potential that is equal to or higher than a standard electrode potential of silver, and second particles having a standard electrode potential lower than a standard electrode potential of silver. A metal compound coating having a potential higher than that of metal particles as the first particles can be formed on a surface of an electrode having a potential lower than that of the metal particles.

19 Claims, 5 Drawing Sheets

CONDUCTIVE ADHESIVE AND PACKAGING STRUCTURE USING THE SAME

BACKGROUND OF THE INVENTION

1. Field of the Invention

The present invention relates to a conductive adhesive used in a field of packaging of electronic elements. Furthermore, the present invention relates to a packaging structure including a substrate and an electronic element that are electrically connected with each other via the conductive adhesive.

2. Description of the Prior Art

Due to a recent trend of environmentally-friendly sensitivity, controls over lead included in solder alloys will be imposed in a field of electronic packaging, and thus, establishment of a lead-free packaging technique, i.e., a technique to join electronic elements with a lead-free material is an urgent necessity. The lead-free packaging technique includes packaging using mainly a lead-free solder or a lead-free conductive adhesive. Conductive adhesives have been noted particularly in the technique since they are expected to provide merits such as joint flexibility and lower packaging temperatures.

A typical conductive adhesive is prepared by dispersing conductive particles in a resin-based adhesive ingredient (binder resin). In general, packaging of an element is carried out by applying a conductive adhesive on a substrate electrode, packaging the element, and subsequently curing the resin. In this way, the joints are adhered with the resin, and the conductive particles are contacted with each other due to the contraction of the resin so that the conductivity at the joints is secured. Since the curing temperature of the conductive adhesive resin is about 150° C. and this is lower than a solder melting point of 240° C., such a conductive adhesive can be used for inexpensive parts having inferior heat resistance. Moreover, since the joints are adhered with a resin, they can respond flexibly to distortion caused by heat and/or external force. Therefore, the conductive adhesive has a merit that less cracks will occur at the joints when compared with a solder having alloy joints. For the above-mentioned reasons, a conductive adhesive is expected as an alternative to solder.

However, a conductive adhesive is inferior to a solder alloy in the packaging reliability in a state being joined with a multipurpose electrode element and with a substrate. In general, base metals such as solder alloys and Cu are used for terminal electrodes of circuit boards and of electronic elements. When electronic elements and circuit boards having terminal electrodes of base metals are packaged with conductive adhesives, the connection resistance is increased remarkably under an atmosphere with high temperature and high humidity. A major factor regarding the increasing connection resistance in a packaging structure with a conductive adhesive is that the base metal used for the electrodes corrodes in the presence of moisture. In other words, particles of a metal such as silver in the conductive adhesive contact with moisture entering the base metal electrode so as to form a kind of electric cell, and thus, the base metal electrode having relatively low potential is corroded. Therefore, multipurpose cells should be replaced by electrodes of expensive metals such as Au or Pd in order to secure moisture-proof reliability when a conductive adhesive is used.

SUMMARY OF THE INVENTION

In order to solve the above-mentioned problems, the present invention provides a conductive adhesive and a packaging structure that can maintain a moisture-proof reliability even when a multipurpose base metal electrode is used.

A conductive adhesive according to the present invention is used to electrically connect an electronic element and a substrate, and the conductive adhesive includes first particles having a standard electrode potential equal to or higher than a standard electrode potential of silver and also second particles having a standard electrode potential lower than a standard electrode potential of silver.

Since the conductive adhesive contains second particles having a low potential and the second particles are subject to sacrificial corrosion, corrosion in the electrodes of the electronic element and of the substrate electrode is controlled.

Furthermore, the present invention provides a packaging structure including an electronic element and a substrate in which the electronic element and the substrate have electrodes connected electrically via the above-mentioned conductive adhesive. In the packaging structure, the second particles corrode and the resulting ingredient can exist as at least one kind of compound selected from an oxide, a hydroxide, a chloride and a carbonate.

Moreover, the present invention provides a packaging structure including an electronic element and a substrate, and the electronic element and the substrate have electrodes connected electrically via a conductive adhesive. This conductive adhesive includes particles having a standard electrode potential that is equal to or higher than a standard electrode potential of silver. A coating of a metal compound having a standard electrode potential higher than that of the particles is formed on a surface of at least one electrode having a standard electrode potential lower than that of the particles and composing the electronic element or the substrate.

In the packaging structure, a coating of a metal compound having a high potential is formed on a surface of the electrode having a low potential in order to control corrosion in the electrode.

BRIEF DESCRIPTION OF THE DRAWINGS

FIGS. 4A and 4B show an analytic result for a composition in a conductive adhesive after a humidity test for samples provided according to the present invention, and the analysis is executed by using SIMS. FIG. 4A shows Zn distribution while

FIGS. 5A and 5B show analytic results for a vicinity of an interface between a conductive adhesive and an electrode of an electronic element after a humidity test concerning a sample provided by a conventional technique, and the analysis is executed by using SIMS. FIG. 5A shows Sn distribution while

DETAILED DESCRIPTION OF THE INVENTION

Preferred embodiments according to the present invention are described below.

For achieving the above-mentioned purposes, a conductive adhesive used in a first aspect of the present invention contains first particles, i.e., particles of a metal such as silver added to secure electric conductivity, and also second particles having a standard electrode potential lower than that of the first particle. In a second aspect, an electrode of the electronic element and/or of the substrate is subject to surface treatment in order to raise the standard electrode potential of the electrode.

The first aspect will be described as follows.

A conductive adhesive containing metal particles (first particles) to secure electric connection, a binder resin, a curing agent and various additives is further provided with second particles. The second particles have a standard electrode potential lower than that of the first particles (i.e., the second particles are more easily corroded), and preferably, the standard electrode potential of the second particles is even lower than those of the electronic element and the circuit board to be connected with. In other words, a preferred relationship of the standard electrode potentials is represented as follows:

(first particles)>(electrodes)>(second particles).

When the standard electrode potential of the second particles is relatively lower than that of the electrodes, the electrodes can be prevented effectively from corroding, since the second particles are connected electrically with the electrodes via the first particle so as to compose a corrosive cell and the second particles having relatively low potential corrode prior to the electrodes. Specifically, the standard electrode potential of the second particles is preferred to be lower than that of Sn in view of the fact that a metal commonly used for an electrode surface is either Sn or an alloy containing Sn.

In a packaging structure, moisture that enters the joints becomes an electrolyte to cause galvanic corrosion.

Actually, water-soluble ingredients contained in the conductive adhesive or in the substrate can be dissolved in the entering water. The ingredients generate electrolytic ions that enhance the electrolytic property of the water and accelerate corrosion in the electrodes and simultaneously, the ions accelerate sacrificial corrosion in the second particles. A certain amount of electrolytic ions will improve reliability in preventing corrosion. The inventors confirmed that 1 ppm to 10000 ppm of electrolytic ions are preferred to exist in a conductive adhesive from a viewpoint of reliability improvement, and more preferably, 1 ppm to 100 ppm. Preferable electrolytic ions include halogen ions (especially, chloride ions) generated from bromine, chlorine or the like, and alkali metal ions generated from sodium, potassium or the like. In the examples described below, remarkable effects for preventing corrosion were observed when Zn particles as second particles and chloride ions coexisted.

Electrolytic ions may influence values of the standard electrode potential. Therefore, when the conductive adhesive contains electrolytic ions of 5 ppm or more, preferably, the above-described relationship is established even for a standard electrode potential where a commonly-used deionized water (the conductivity is not more than 1 $\mu S^{-1}$) is replaced by water containing electrolytic ions by taking an actual corrosion process into consideration. The above-mentioned deionized water including 3 wt % NaCl can be used for a specific measuring object.

Preferably, the first particles are selected from particles of noble metals such as gold (Au), silver (Ag), platinum (Pt), palladium (Pd), iridium (Ir), rhodium (Rh), osmium (Os), ruthenium (Ru), and alloys of noble metals such as an Ag-Pd alloy. Particles containing metals other than the noble metals, for example, copper (Cu) particles coated with Ag also can be used as long as the particles have a standard electrode potential not lower than a standard electrode potential of silver. Silver (Ag) particles are preferred for the first particles when volume resistivity values and material cost are taken into consideration.

A content of the first particles in the conductive adhesive is determined to keep the electric connection even when the second particles corrode. Specifically, the content may range from 70 wt % to 95 wt % of the conductive adhesive.

The second particles are preferred to contain a base metal or a nonmetal, specifically, at least one selected from iron (Fe), carbon (C), aluminum (Al), zinc (Zn), magnesium (Mg), nickel (Ni), copper (Cu), beryllium (Be), chromium (Cr), tin (Sn), vanadium (V) and calcium (Ca).

The second particles are preferred to have a property for easy formation of an oxide. Specifically, the inclusion of at least one selected from Zn, Fe, Mg, Cu, V, Ca and Be, and Zn is the most preferred. The second particles, when oxidized, contain on the surface many hydroxide groups that are easy to be bonded chemically with resin. Adherence between the binder resin and the metal particles is improved due to the bonding, and thus, moisture can be prevented from entering the joints.

The second particles can contain plural elements such as carbon steel, SnAg, SnBi, SnCu, FeNi, BeCu and stainless steel. When an alloy is used for the second particles, an ingredient having a lower potential (Sn for SnAg) can be used to compare the potentials.

A content of the second particles in general may range from 0.5 wt % to 10 wt % of the conductive adhesive. When the content is too low, sufficient effects cannot be obtained in controlling corrosion, while excessively high content may affect negatively the conductivity of the conductive adhesive. From this point of view, a content of the second particles is preferred to be higher than 2 wt %, more preferably not less than 3 wt % of the conductive adhesive.

When a lead element is used for the electronic element, effects in preventing corrosion are improved by selecting the content of the second particles to be more than 2 wt % but not more than 10 wt %. The reason can be considered as follows. Compared to a case where a chip element is used, less pressure will be applied to a conductive adhesive at a time of mounting when a lead element is used similar to a case of QFP (quad flat package). Unlike a chip element provided with a terminal electrode to the device, a lead of a lead element is projected to make a terminal electrode that functions as a spring to relax stress applied to the device.

When sufficient pressure is not applied to the conductive adhesive, sufficient electric contact cannot be kept between the first particles (e.g., Ag particles) and the electrode surface (e.g., SnPb). In this situation, electric connection between the second particles (e.g., Zn particles) and the electrode can be insufficient and the second particles tend to be consumed due to self-corrosion. Therefore, when a chip element is packaged, the amount of the second particles to be added is preferred to increase slightly to make up for the self-corrosion.

Since addition of the second particles serves to control corrosion, a base metal can be used for the electrodes of the electronic element and of the circuit board. Though there is no specific limitation on base metals used for the electrodes, corrosion control is especially effective when the metal is at least one that is vulnerable to galvanic corrosion and selected from Sn, Pb, Cu, Ni, Fe and Be.

When the thus obtained packaging structure where corrosion at the joints is controlled is used or kept under a circumstance to accelerate galvanic corrosion, corrosion in the second particles will progress. As a result, the second particles will be a corrosion product (typically at least one compound selected from an oxide, a hydroxide, a chloride, and a carbonate). The present invention includes a packaging structure comprising the second particles that have been corroded and modified from the initial state at the time of addition. In this embodiment, the corrosion controlling effect of the second particles can be confirmed if corrosion progresses more in the second particles than in the electrodes.

As mentioned above, the present invention can be regarded also as a method of controlling corrosion of an electrode, and the method includes a step of preparing a conductive adhesive containing first particles having a standard electrode potential higher than a standard electrode potential of silver and second particles having a standard electrode potential lower than a standard electrode potential of silver; and a step of controlling corrosion of an electrode of the electronic element and/or of the substrate by packaging the electronic element on the substrate via the conductive adhesive.

The conductive adhesive can include further an organic solvent. Since the added organic solvent serves to partially dissolve resin ingredients at the interface between the conductive adhesive and the electrode, good electric contact between the first particles and the electrode can be maintained. Glycol ethers or the like are preferably used to obtain this effect, and more specifically, the following ingredients can be used: diethylene glycol monobutyl ether, diethylene glycol monobutyl ether acetate, ethylene glycol monobutyl ether, ethylene glycol monobutyl ether acetate, propylene glycol monomethyl ether, propylene glycol monomethyl ether acetate, propylene glycol monoethyl ether, and propylene glycol monoethyl ether acetate.

Addition of an organic solvent having high polarity can improve moisture-proof further qualities since such an organic solvent tends to act as a medium for a sacrificial corrosion reaction. To obtain this effect, it is preferable to use an organic solvent having a dielectric constant of at least 15, for example, DEG (diethylene glycol: 31.69; the value indicates dielectric constant), EG (ethylene glycol: 38.66), DMF (N,N'-dimethylformamide: 36.71), N,N'-dimethylacetamide: 36.71, DMSO (dimethyl sulfoxide: 46.5), HMPA (hexamethylphosphoric triamide: 29.6), NMP (N-methyl-2-pyrrolidone: 32.3), and the like.

A content of the organic solvent is not limited specifically, but it is preferably in the range from 0.1 wt % to 10 wt % of a conductive adhesive.

The moisture-proof reliability of the conductive adhesive is improved further when the conductive adhesive includes an additional material having an action of removing a metal oxide film. Natural oxide films that can be formed on the surfaces of the second particles will lower the surface activity of the second particles. Such a natural oxide film can be formed on the surface of an electrode as well, and the film will control sacrificial corrosion of the second particles and thus, self-corrosion will be accelerated. Therefore, it is possible to control self-corrosion of the second particles and accelerate sacrificial corrosion by adding a material for removing a metal oxide film so as to remove or decrease the oxide film on the surface of the second particles (and on the electrode after packaging). Control of the self-corrosion of the second particles is also effective in keeping the moisture-proof for a long time. The metal oxide is not necessarily removed completely, but it can be reduced when compared to a case where the above-mentioned material is not included in the conductive adhesive.

Addition of an activator is helpful to remove or decrease metal oxide films on surfaces of the second particles and/or the electrode. The activator used here can be an ingredient that will be added to a solder flux; for example, activated rosin, a triol-based compound, and a halogenated organic compound. In addition, various organic acids, organic acid chlorides, inorganic acids, inorganic metallic acid chlorides or the like having the above-mentioned action can be used. Specific examples of the activator include oleic acid, lactic acid, benzoic acid, o-aminobenzoic acid, m-aminobenzoic acid, p-aminobenzoic acid, glycerol, citric acid, stearic acid, oxalic acid, urea, thiourea, ethylenediamine, diethylenetriamine, hydrazine, glutamic acid hydrochloride, aniline hydrochloride, cetylpyridine bromide, abietic acid, phenylhydrazine hydrochloride, tetrachloronaphthalene, methylhydrazine hydrochloride, dimethylamine hydrochloride, diethylamine hydrochloride, dibutylamine hydrochloride, cyclohexylamine hydrochloride, diethylethanolamine hydrochloride, zinc chloride, stannous chloride, potassium chloride, cuprous chloride, nickel chloride, ammonium chloride, tin bromide, zinc bromide, sodium bromide, ammonium bromide, sodium chloride, and lithium chloride.

Antioxidants also can be used to decrease metal oxide films formed on the surfaces of the second particles. The antioxidants available include, for example, sulfur-based antioxidant, phosphorus-based antioxidant, amine-based antioxidant and phenol-based antioxidant; such as, phenyl salicylate, monoglycol salicylate, 2-hydroxy-4-methoxybenzophenon, 2(2'-hydroxy-5'-methylphenyl) benzotriazole, 2-mercaptobenzimidazole, N-salicyloyl-N'-acetylhydrazine, 6-ethoxy-2,2,4-trimethyl-1,2-dihydroquinoline, phenyl-B-naphthylamine, α-naphthylamine, 2,6-di-t-butyl-p-cresol, 2,6-di-t-butyl-phenol, triphenyl phosphite, tridecyl phosphite, trioctadecyl phosphite, trilauryl trithiophosphite, ascorbic acid, glucose, dilauryl thiodipropionate, distearyl thiodipropionate, 2-mercaptobenzimidazole, dilauryl sulphide, propyl gallate, octyl gallate, dodecyl gallate, and B-B'-thiodipropionic acid.

A content of at least one additive selected from the activator and the antioxidant is not limited specifically, but it is preferably in a range from 0.1 wt % to 10 wt % of the conductive adhesive.

In general, the conductive adhesive should include a binder resin. The binder resin can be a thermosetting resin such as an epoxy resin, a phenol resin, a urea resin, a melamine resin, a furan resin, an unsaturated polyester resin, a diallyphthalate resin and a silicone resin. The binder resin can include as well a thermoplastic resin such as a polyvinyl chloride resin, a vinylidene chloride resin, a polystyrene resin, an ionomer resin, a methylpentene resin, a polyallomer resin, a fluorine resin, a polyamide resin, a polyimide resin, a polyamide imide resin, and polycarbonate. However, since a thermoplastic resin will lower the bond strength, the binder resin is preferably composed of a thermosetting resin.

A content of the binder resin is not limited specifically, but a preferable range is from 5 wt % to 25 wt % of a conductive adhesive.

The conductive adhesive can include further a curing agent, a bonding modifier, a discoloring inhibitor, a sagging inhibitor, or the like.

The following description is about a second aspect.

A surface of an electrode of an electronic element and/or a circuit board is modified, and a metal compound coating is formed on the surface in order to raise the electrode potential. In this case, an especially preferred relationship of the standard electrode potentials is as follows:

(metal compound coating)>(metal particles/first particles)≧(silver).

Corrosion in the electrode can be controlled effectively by selecting the electrode potential to be relatively high. Corrosion in the metal particles will not progress substantially since the metal particles have a standard electrode potential that is equal to or higher than that of silver. There is no need to form metal compound coatings on all of the electrodes, but such a coating will be formed on an electrode that needs protection from corrosion, i.e., an electrode having a standard electrode potential lower than that of the metal particles.

Specifically, the metal compound coating can be modified, for example, by sulfurizing the surface metal of the terminal electrode or by contacting the surface with an inorganic acid so as to form a metal chloride. The modification method is not limited specifically, but, sulfurization caused by a contact with hydrogen sulfide is a preferred example.

Preferably, electrical resistivity of the metal compound coating is not more than $1 \times 10^{-4}$ Ωcm, so that harmful effects for the connection resistance of the packaging structure can be prevented.

Preferably, the metal compound coating comprises a metal compound that is substantially insoluble in water. Substantial water insolubility indicates here that the solubility s (maximum quantity soluble in 100 g of water) is less than about $1 \times 10^{-2}$ g, and solubility product Ksp for water is less than about $1 \times 10^{-5}$. Both the solubility s and the solubility product Ksp are based on values at water temperature of 20° C. hereinafter.

The metal compound coating is preferably a coating of a metal sulfide, since many metal sulfides are compounds having water-insolubility and great electroconductivity. For example, tin sulfide (SnS) is insoluble in water (solubility product: $1 \times 10^{-27}$) and it has an electrical resistivity of not more than $1 \times 10^{-4}$ Ωcm. Such a metal compound composing a coating can be a metallic salt such as a chromate, an oxalate, a phosphate, or a sulfate; or the metal compound can form a complex.

Since the metal compound coating controls corrosion as well in this case, electrodes of the electronic element and of circuit board can be made of a base metal. There is no limitation on the base metal used in the electrodes, as the corrosion control demonstrates a desired effect when using any of the above-described metals in which galvanic corrosion progresses easily.

Figure 1:
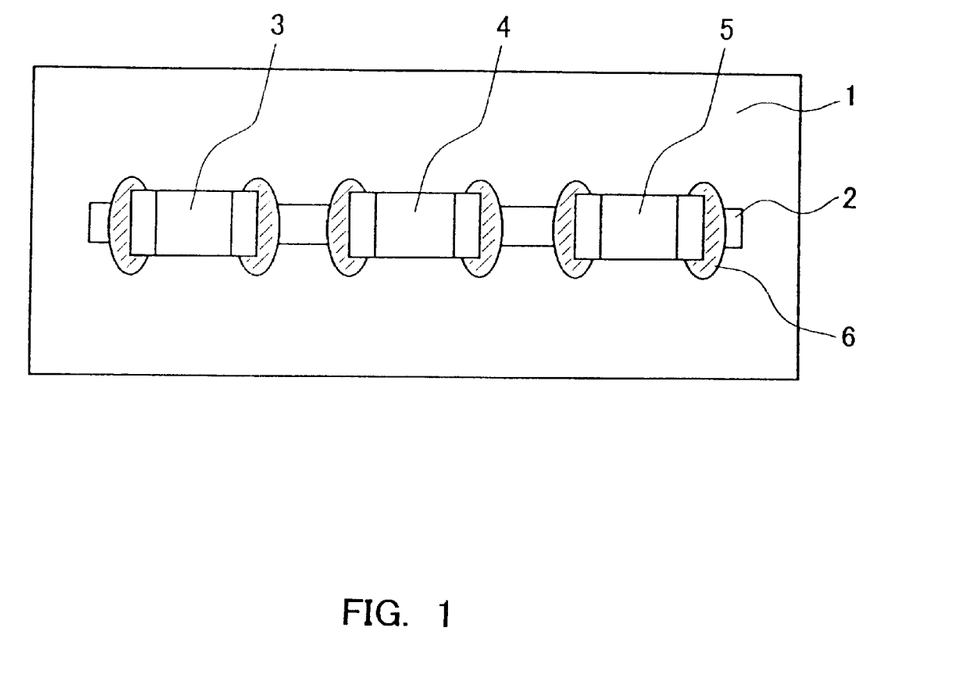
FIG. 1 is a plan view to illustrate an embodiment of a packaging structure in the present invention.

FIG. 1 is a plan view illustrating an example of a packaging structure using chip parts. This packaging structure is composed by surface-packaging chip resistors 3, 4, and 5 of a distinct electric structure on an electrode 2 on a ceramic circuit board 1. A conductive adhesive layer 6 comprising a conductive adhesive according to the present invention is provided on the electrode 2. The electrode 2 and the chip parts 3–5 are electrically connected to each other via the conductive adhesive layer 6. Alternatively, a metal compound coating is formed on the electrode 2 on the circuit board and/or on electrodes of the chip parts. The chip resistors can be replaced by other parts such as chip capacitors.

Figure 3A:
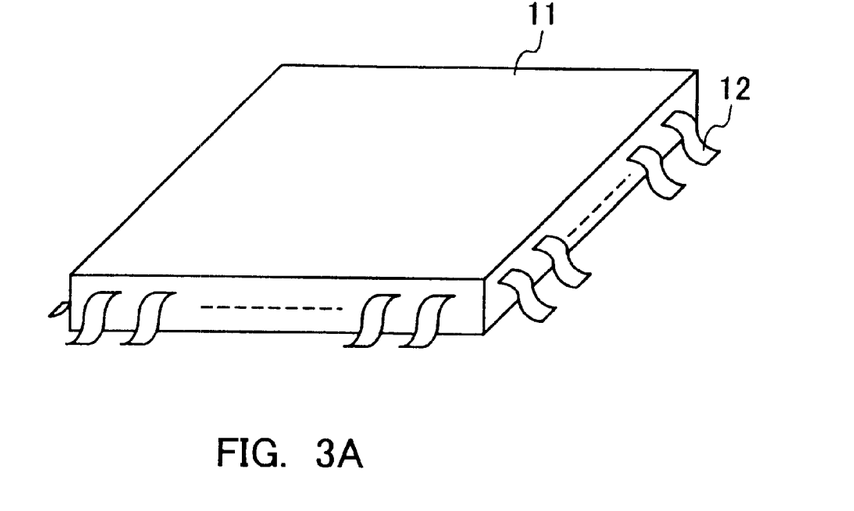
FIG. 3A is a perspective view to illustrate an example of a lead element.
Figure 3B:
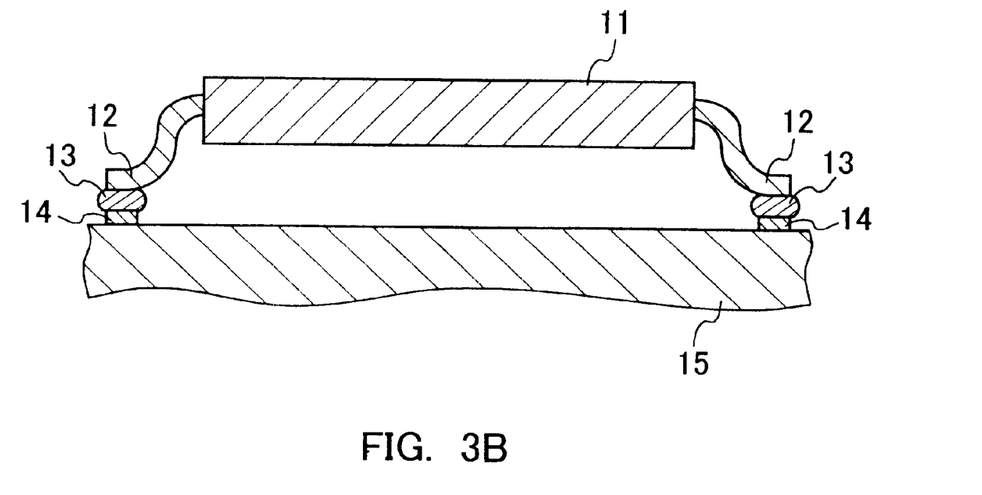
FIG. 3B is a cross-sectional view to illustrate an embodiment of a packaging structure using a lead according to the present invention.

FIG. 3A is a perspective view to illustrate a QFP as an example of a lead element. Plural leads 12 protruding from side faces of the device 11 of the lead element extend downwards in a curved state. As shown in FIG. 3B, this QFP is joined to a land 14 of a substrate 15 via a conductive adhesive 13.

EXAMPLES

The present invention will be described below in detail with reference to examples, however, the present invention is not limited to the examples.

Figure 2:
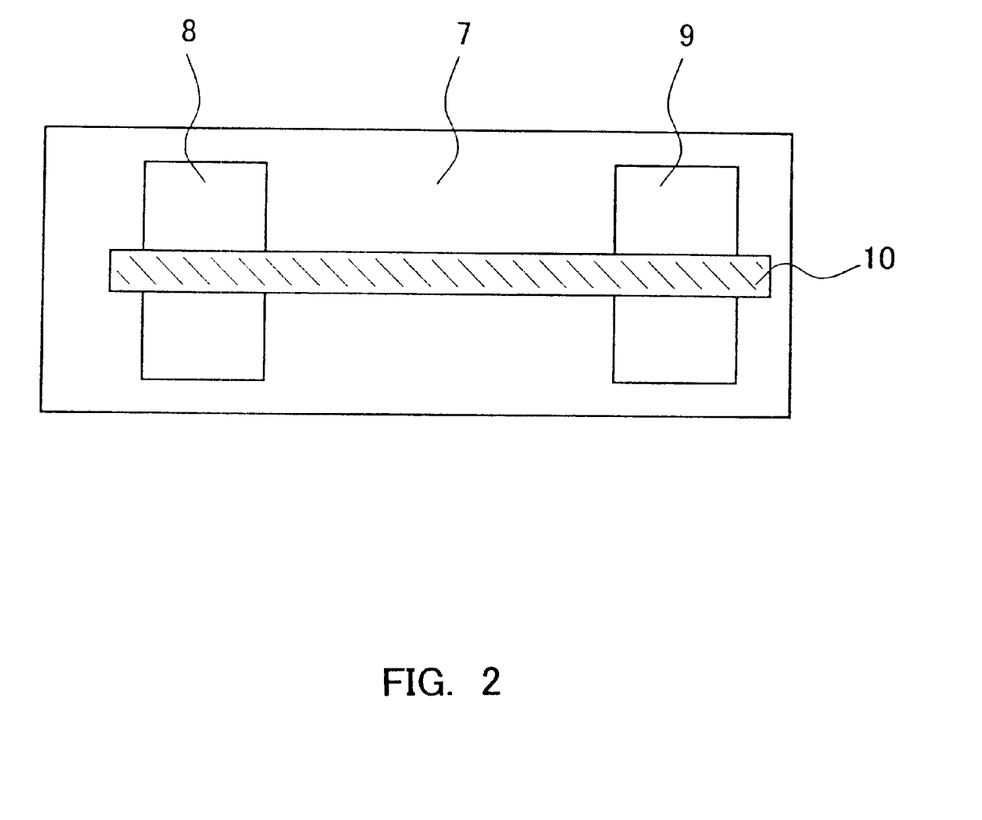
FIG. 2 is a plan view to illustrate a specimen used for evaluating a conductive adhesive in the present invention.

In the following Examples 1–12 and Comparative Examples 1–2, change in electrical resistance was measured by using a specimen shown in FIG. 2. This specimen comprises a substrate 7 on which electrodes 8 and 9 are formed with a space of 30 mm therebetween. The electrodes 8 and 9 have surfaces of a SnPb alloy ($Sn_{90}Pb_{10}$ alloy). A conductive adhesive was manufactured by preparing metal particles A comprising 7 wt % bisphenol F-type epoxy resin (liquid), 2 wt % additives (a dispersant, a bonding modifier etc.) and 89 wt % Ag, adding 2 wt % of predetermined metal particles B, and kneading the mixture by using a three-roll type apparatus. In addition to that, an organic solvent, an activator, and an antioxidant were added to some samples. For such samples, amount of the bisphenol F-type epoxy resin was decreased by the same amount of the additional ingredients.

Here, the metal particles A are substantially spherical and the average diameter is 2–15 μm.

Subsequently, a conductive adhesive layer 10 was formed to bridge these electrodes by screen printing. Furthermore, the conductive adhesive layer was heated to cure in an oven for 30 minutes at a temperature of 150° C. The thus prepared specimen was subject to a humidity test by being left for 1000 hours in a thermo-hygrostat bath kept at 85° C. with a relative humidity of 85% in order to measure the electrical resistance between the electrodes 8 and 9 before and after the test (an initial resistance value and a measurement value after the test).

Example 1

The metal particles B used here were Ni particles (substantially spherical and the diameter is 3–7 μm, or the average diameter is 5 μm).

The standard electrode potential meets the relationship of Ni(−0.25 V)<Sn(−0.14 V)<Pb(−0.13 V)<Ag(+0.80 V). Therefore, the metal particles B have a potential lower than that of the SnPb alloy.

Example 2

The metal particle B used here were carbon steel particles (spherical and the average diameter is 5 μm, the carbon content is 5 wt %).

The standard electrode potential meets the relationship of C(−0.76 V) <Pb(−0.50 V)<Sn(−0.42 V)<Ag(−0.13 V) in a deionized water including 3 wt % NaCl. Similar to Example 1, the relationship between the C, Pb, Sn and Ag concerning the standard electrode potential measured in the deionized water is as described above.

Examples 3–12

The metal particles B used here were Zn particles (spherical and the average diameter is 5 μm).

Under the above-mentioned measurement condition where a chloride ions exist, the standard electrode potential meets a relationship of Zn(−1.03 V)<Pb(−0.50 V)<Sn(−0.42 V)<Ag(−0.13 V). Zn will form an oxide more easily than Ni or C does. For a measurement concerning the deionized water, relationship of the standard electrode potentials between Zn, Pb, Sn and Ag is same as the relationship mentioned above.

In Examples 4–12, an organic solvent and/or an activator/antioxidant were added further in an appropriate manner.

Comparative Example

Measurement was performed as in the above Examples without adding the metal particles B.

The following Table 1 shows the thus obtained results.

applied with the conductive adhesive. The standard electrode potential meets a relationship of Ag(0.80 V)<SnS(0.87 V)<PbS(0.93 V).

SnS and PbS are substantially insoluble in water (a solubility product Ksp of SnS is $1\times10^{-27}$, and a solubility s of PbS is $1\times10^{-3}$ g/100 g water), and they have a high conductivity, i.e., the electrical resistance is not more than $1\times10^{-4}$ Ωcm.

TABLE 1

|  | Metal particles B (wt %) | NaCl (ppm) | Solvent (wt %) | Activator/antioxidant (wt %) |  | Initial resistance (mΩ) | Resistance after test (mΩ) |
|---|---|---|---|---|---|---|---|
| Ex. 1 | Ni | 2 | 5 | — | — | 13 | 29 |
| Ex. 2 | C steel | 2 | 5 | — | — | 13 | 21 |
| Ex. 3 | Zn | 2 | 5 | — | — | 13 | 18 |
| Ex. 4 | Zn | 2 | 5 | BC 2 | — | 12 | 16 |
| Ex. 5 | Zn | 2 | 5 | DEG 2 | — | 12 | 15 |
| Ex. 6 | Zn | 2 | 5 | DEG 2 L(+)-ascorbic acid | 0.5 | 11 | 11 |
| Ex. 7 | Zn | 2 | 5 | DEG 2 D(+)-glucose | 0.5 | 11 | 11 |
| Ex. 8 | Zn | 2 | 5 | DEG 2 Oleic acid | 0.5 | 11 | 11 |
| Ex. 9 | Zn | 2 | 5 | DEG 2 Glycerol | 0.5 | 11 | 11 |
| Ex. 10 | Zn | 2 | 5 | DEG 2 Zinc chloride | 0.5 | 11 | 11 |
| Ex. 11 | Zn | 2 | 5 | DEG 2 Phenyl salicylate | 0.5 | 11 | 11 |
| Ex. 12 | Zn | 2 | 5 | DEG 2 Octyl gallate | 0.5 | 11 | 11 |
| Com. Ex. 1 | — | 2 | 5 | — | — | 12 | 326 |

BC: diethylene glycol monobutyl ether,
DEG: diethylene glycol
Ex.: Example
Com. Ex.: Comparative Example Detected sodium chloride is considered to have been included in the bisphenol F-type epoxy resin. Resistance value in Example 1 was slightly higher than in other examples, since Ni has a standard electrode potential higher than that of Pb under the above-mentioned measurement condition having electrolytic ions. The results in Table 1 demonstrate that addition of an organic solvent, an activator/antioxidant is effective to prevent the resistance value from being lowered in the initial stage and being raised subsequently.

Examples 13–24

Actual chip element structures were manufactured by using the conductive adhesives of Examples 1–12.

Similar to the structure shown in FIG. 1, an electrode of SnPb-plated Cu was formed on a surface of a ceramic circuit board (30×60 mm, 1.6 mm in thickness). Using any of the above-mentioned conductive adhesives, this electrode was packaged with a 0Ω chip resistor (3216 size, SnPb plated), a chip coil (8 mmΦ in diameter, 4 mm in height, SnPb-plated), and a chip capacitor (3216 size, SnPb-plated). The conductive adhesives were applied and cured in the same manner as described in the above Examples.

In Examples 13–24, the conductive adhesives of Examples 1–12 are used respectively.

Example 25

In this example, a chip element packaging structure was manufactured as in Examples 13–24 by using a conventional conductive adhesive described in Comparative Example 1. In Example 25, the surface metal of the electrode on the ceramic circuit board was sulfurized. Specifically, a ceramic circuit board was introduced in a closed tank 0.34 m³ in capacity, being kept at a temperature of 40° C. and at a relative humidity of 90%, and fed with hydrogen sulfide for 24 hours so that the hydrogen sulfide concentration in the tank became 3 ppm before the ceramic circuit board was Comparative Example 2

A chip element packaging structure similar to those of Examples 13–24 was manufactured by using a conventional conductive adhesive of Comparative Example 1. In this comparative example, the electrode on the circuit board was not surface-treated.

The thus obtained chip element packaging structure was kept for 1000 hours in a thermo-hygrostat bath maintaining a relative humidity of 85% at 85° C., and the series resistance of three parts was measured before and after the treatment. The results are shown in Table 2.

TABLE 2

Resistance value: Ω

|  | Conductive Adhesive | Electrode surface treatment | Initial resistance value | Measuring value after test |
|---|---|---|---|---|
| Example 13 | Example 1 | — | 2.5 | 3.6 |
| Example 14 | Example 2 | — | 2.5 | 3.1 |
| Example 15 | Example 3 | — | 2.5 | 2.8 |
| Example 16 | Example 4 | — | 2.4 | 3.5 |
| Example 17 | Example 5 | — | 2.4 | 3.0 |
| Example 18 | Example 6 | — | 2.3 | 2.5 |
| Example 19 | Example 7 | — | 2.3 | 2.5 |
| Example 20 | Example 8 | — | 2.3 | 2.5 |
| Example 21 | Example 9 | — | 2.3 | 2.5 |
| Example 22 | Example 10 | — | 2.3 | 2.5 |
| Example 23 | Example 11 | — | 2.3 | 2.5 |
| Example 24 | Example 12 | — | 2.3 | 2.5 |
| Example 25 | Com. Ex 1 | sulfuration (SnS,PbS) | 2.5 | 2.6 |
| Com. Ex. 2 | Com. Ex 1 | — | 2.5 | 251.2 |

Examples 26–36

Lead element structures were manufactured as in the above-mentioned chip element structures by using the respective conductive adhesives, and the structures were subjected to a humidity test.

Each lead element structure was configured as shown in FIG. 3 by forming a land electrode of SnPb-plated Cu on the surface of the circuit board and by packaging 25 QFPs with a package size of 15×15 mm per lead by using any of the above-mentioned conductive adhesives. Spacing between the lead terminals (12 in FIG. 3) was 0.5 mm. The resistance value was measured for all of the spacing between adjacent lead terminals being connected electrically by a daisy chain through the device, and the average value was determined as the resistance value.

The conductive adhesives and resistance values before and after the humidity test are shown in Table 3.

TABLE 3

|  | Metal particles B (wt %) | NaCl (ppm) | Solvent (wt %) | Activator/antioxidant (wt %) |  | Initial resistance (mΩ) | Resistance after test (mΩ) |
|---|---|---|---|---|---|---|---|
| Ex. 26 | Zn | 2 | 5 | — | — | 53 | 79 |
| Ex. 27 | Zn | 2.5 | 5 | — | — | 53 | 58 |
| Ex. 28 | Zn | 3 | 5 | — | — | 53 | 56 |
| Ex. 29 | Zn | 3 | 5 | DEG 2 | — | 53 | 55 |
| Ex. 30 | Zn | 3 | 5 | DEG 2 L(+)-ascorbic acid | 0.5 | 52 | 52 |
| Ex. 31 | Zn | 3 | 5 | DEG 2 D(+)-glucose | 0.5 | 52 | 52 |
| Ex. 32 | Zn | 2 | 5 | DEG 2 oleic acid | 0.5 | 52 | 52 |
| Ex. 33 | Zn | 2 | 5 | DEG 2 glycerol | 0.5 | 52 | 52 |
| Ex. 34 | Zn | 2 | 5 | DEG 2 zinc chloride | 0.5 | 52 | 52 |
| Ex. 35 | Zn | 2 | 5 | DEG 2 phenyl salicylate | 0.5 | 52 | 52 |
| Ex. 36 | Zn | 2 | 5 | DEG 2 octyl gallate | 0.5 | 52 | 52 |

Ex.: Example

As shown in Table 3, an effect of the added second particles (metal particles B) in packaging a lead element became apparent when the content exceeded 2 wt %, and the effect was stabilized when the content was 3 wt % or more.

Figure 4A:
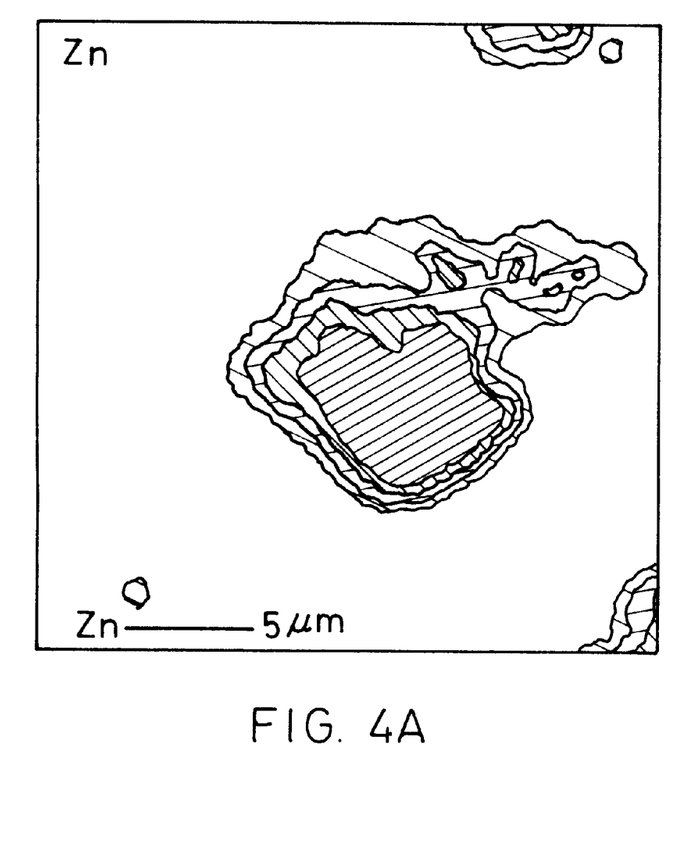
Figure 4B:
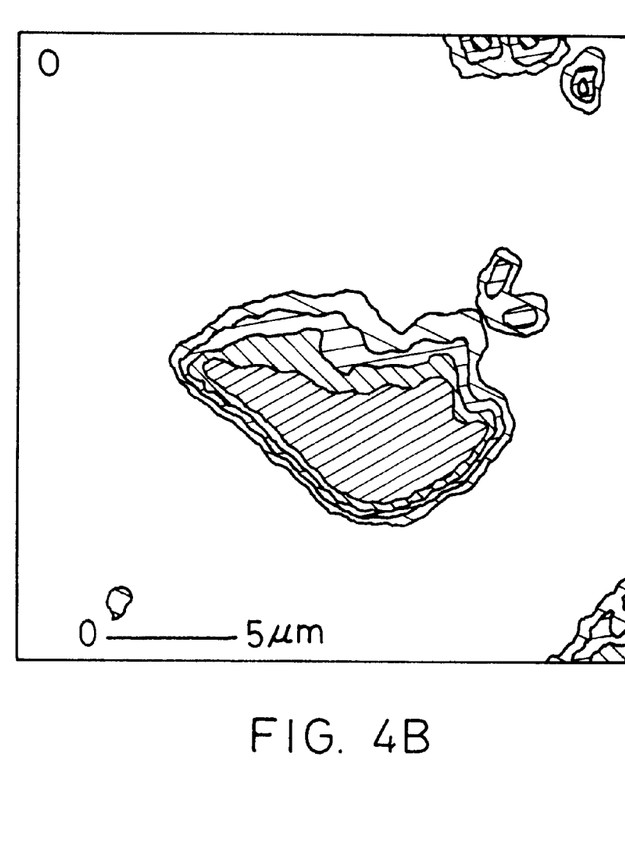
FIG. 4B shows O distribution.

In Example 15, the cross section of the conductive adhesive after the test was analyzed by SIMS (secondary ion composition analysis method). As indicated in FIGS. 4A and 4B, areas with a high Zn concentration and areas with a high O concentration correspond well with each other. Narrower hatching pitches in FIGS. 4 and 5 indicate that the concentrations of the detected elements were high. In the Zn particles of the conductive adhesive, oxygen atoms were dispersed in a substantially uniform state after the humidity test. The Zn particles are considered to have been changed into either an oxide or a hydroxide as a whole due to the sacrificial corrosion.

Figure 5A:
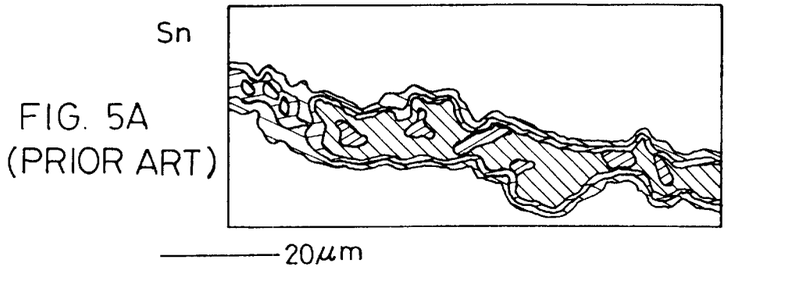
Figure 5B:
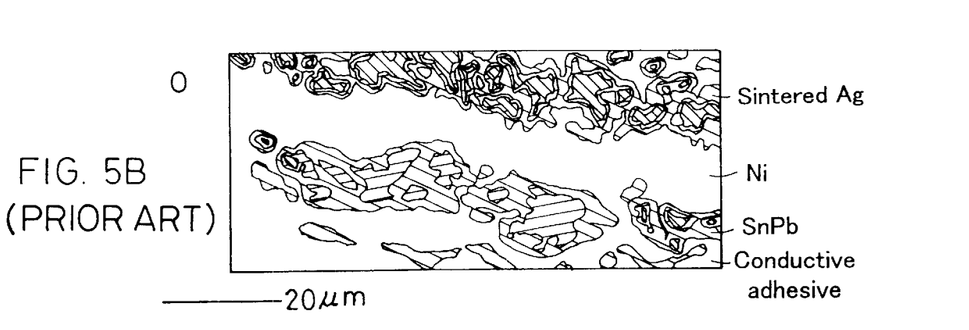
FIG. 5B shows O distribution.

In Comparative Example 2, the cross section in the vicinity of the interface between the conductive adhesive and the element electrode after the test was analyzed by SIMS. As shown in FIGS. 5A and 5B, the oxygen concentration was raised slightly where the Sn concentration was high. On the other hand, oxygen concentration in the conductive adhesive was lower than that on the electrode surface (FIG. 5B).

The above Examples relate to chip element packaging structures and lead element packaging structures. The present invention is not limited thereto but it can be used for packaging various parts such as packaging parts including CSP (chip scale package), BGA (ball grid array), chip parts/lead parts including electrolytic capacitors, diodes and switches, and IC bare packages.

As mentioned above, the present invention provides a conductive adhesive and a packaging structure with improved moisture-proof reliability. Especially, since the present invention can improve the moisture-proof while using a multipurpose base metal electrode, it can increase range of uses for a conductive adhesive and a packaging structure using the same.

The present invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A packaging structure comprising an electronic element, a substrate and a conductive adhesive, the electronic element having an electrode electrically connected with an electrode of the substrate via the conductive adhesive,
   wherein the conductive adhesive comprises first particles for securing electric conductivity, and second particles having a standard electrode potential lower than a standard electrode potential of the first particles, and the standard electrode potential of the second particles is lower than any of the standard electrode potential of the electrode of the electronic element and the standard electrode potential of the electrode of the substrate.

2. The packaging structure according to claim 1, wherein at least one selected from the electrode of the electronic element and the electrode of the substrate comprises at least one element selected from Sn, Pb, Cu, Ni, Fe and Be.

3. The packaging structure according to claim 1, wherein a standard potential of the first particles is higher than any of the standard electrode potential of the electrode of the electronic element and the standard electrode potential of the electrode of the substrate.

4. The packaging structure according to claim 1, further comprising 1 ppm to 10000 ppm of electrolytic ions.

5. The packaging structure according to claim 4, wherein the electrolytic ions comprise chloride ions.

6. The packaging structure according to claim 1, wherein a content of the first particles ranges from 70 wt % to 95 wt %.

7. The packaging structure according to claim 1, wherein a content of the second particles ranges from 0.5 wt % to 10 wt %.

8. The packaging structure according to claim 7, wherein a content of the second particles is more than 2 wt %.

9. The packaging structure according to claim 1, wherein the adhesive further comprises an organic solvent.

10. The packaging structure according to claim 9, wherein the organic solvent is a polar solvent having a dielectric constant of at least 15.

11. The packaging structure according to claim 1, wherein the conductive adhesive further comprises a material for removing a metal oxide film, wherein the material removes or decreases metal oxide films on the surfaces of the second particles.

12. The packaging structure according to claim 1, wherein the conductive adhesive further comprises at least one agent selected from an activator and an antioxidant.

13. A packaging structure comprising an electronic element, a substrate and a conductive adhesive, the electronic element having an electrode electrically connected with an electrode of the substrate via the conductive adhesive, wherein the conductive adhesive comprises first particles for securing electric conductivity, and at least one compound selected from an oxide, a hydroxide, a chloride and a carbonate produced as a result of corrosion of second particles that have a standard electrode potential lower than a standard electrode potential of the first particles, and the standard electrode potential of the second particles is lower than any of the standard electrode potential of the electrode of the electronic element and the standard electrode potential of the electrode of the substrate.

14. The packaging structure according to claim 13, wherein at least one selected from the electrode of the electronic element and the electrode of the substrate comprises at least one element selected from Sn, Pb, Cu, Ni, Fe and Be.

15. A packaging structure comprising an electronic element, a substrate and a conductive adhesive, the electronic element having an electrode electrically connected with an electrode of the substrate via the conductive adhesive, wherein the conductive adhesive comprises particles, a material of at least one electrode selected from the electrode of the electronic element and the electrode of the substrate has a standard electrode potential lower than that of the particles, and a metal compound coating having a standard electrode potential higher than the standard electrode potential of the particles is formed on a surface of said at least one electrode.

16. The packaging structure according to claim 15, wherein the metal compound coating has an electrical resistivity of not more than $1 \times 10^{-4}$ $\Omega$cm.

17. The packaging structure according to claim 15, wherein the metal compound coating is composed of a metal compound that is substantially insoluble in water.

18. The packaging structure according to claim 15, wherein the metal compound coating is a metal sulfide coating.

19. The packaging structure according to claim 15, wherein at least one selected from the electrode of the electronic element and the electrode of the substrate comprises at least one element selected from Sn, Pb, Cu, Ni, Fe and Be.

* * * * *